(12) United States Patent
Lee et al.

(10) Patent No.: US 10,522,332 B2
(45) Date of Patent: Dec. 31, 2019

(54) PLASMA PROCESSING SYSTEM, ELECTRON BEAM GENERATOR, AND METHOD OF FABRICATING SEMICONDUCTOR DEVICE

(71) Applicant: Samsung Electronics Co., Ltd., Suwon-si, Gyeonggi-do (KR)

(72) Inventors: Yeongkwang Lee, Suwon-si (KR); Sunggil Kang, Hwaseong-si (KR); Sang Ki Nam, Seongnam-si (KR); Kwangyoub Heo, Yongin-si (KR); Kyuhee Han, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/421,433

(22) Filed: May 23, 2019

(65) Prior Publication Data

US 2019/0279846 A1  Sep. 12, 2019

Related U.S. Application Data

(62) Division of application No. 15/870,800, filed on Jan. 12, 2018, now Pat. No. 10,347,468.

(30) Foreign Application Priority Data

Oct. 23, 2017  (KR) .......................... 10-2017-0137423

(51) Int. Cl.
*H01J 37/317* (2006.01)
*H01J 37/32* (2006.01)
*H01L 21/683* (2006.01)

(52) U.S. Cl.
CPC ...... *H01J 37/3244* (2013.01); *H01J 37/3233* (2013.01); *H01J 37/3266* (2013.01);
(Continued)

(58) Field of Classification Search
USPC ......................................... 483/710
See application file for complete search history.

(56) References Cited

U.S. PATENT DOCUMENTS

| | | | | |
|---|---|---|---|---|
| 5,900,443 | A | ‡ | 5/1999 | Stinnett .................. B29C 59/16 156/272.2 |
| 6,348,158 | B1 | ‡ | 2/2002 | Samukawa ......... H01J 37/3233 216/61 |

(Continued)

FOREIGN PATENT DOCUMENTS

| | | | |
|---|---|---|---|
| JP | 2009200275 | A ‡ | 9/2009 |
| JP | 2009200275 | A | 9/2009 |

(Continued)

*Primary Examiner* — Christopher M Raabe
(74) *Attorney, Agent, or Firm* — Renaissance HP Law Group LLP

(57) ABSTRACT

A chamber has an upper housing and a lower housing and receives a reaction gas. A first plasma source includes electron beam sources providing electron beams into the upper housing to generate an upper plasma. A second plasma source includes holes generating a lower plasma within the holes connecting the upper housing and the lower housing. Radicals of the upper plasma, radicals of the lower plasma, and ions of the lower plasma are provided, through the holes, to the lower housing so that the lower housing has radicals and ions at a predetermined ratio of the ions to the radicals in concentration. The second plasma source divides the chamber into the upper housing and the lower housing. A wafer chuck is positioned in the lower housing to receive a wafer.

7 Claims, 11 Drawing Sheets

(52) U.S. Cl.
CPC .. *H01J 37/32357* (2013.01); *H01J 37/32366* (2013.01); *H01J 37/32422* (2013.01); *H01L 21/6831* (2013.01)

(56) References Cited

U.S. PATENT DOCUMENTS

| | | | | |
|---|---|---|---|---|
| 7,195,936 B2 ‡ | 3/2007 | Onishi | ................ | C23C 16/56 438/16 |
| 7,262,555 B2 ‡ | 8/2007 | Rueger | ............... | H01J 37/3233 216/67 |
| 7,649,316 B2 ‡ | 1/2010 | Rueger | ................ | H01J 9/02 313/58 |
| 7,829,469 B2 ‡ | 11/2010 | Chen | ................ | H01J 37/32091 156/34 |
| 8,574,445 B2 ‡ | 11/2013 | Cho | ................ | G03F 7/427 118/71 |
| 9,111,728 B2 ‡ | 8/2015 | Holland | ............ | H01J 37/32357 |
| 9,443,700 B2 ‡ | 9/2016 | Dorf | ................ | H01J 37/3233 |
| 2004/0014325 A1 ‡ | 1/2004 | Laermer | ............ | H01J 37/321 438/710 |
| 2004/0137760 A1 ‡ | 7/2004 | Onishi | ................ | C23C 16/56 438/79 |
| 2006/0208649 A1 ‡ | 9/2006 | Rueger | ............... | H01J 37/3233 315/11 |
| 2008/0099431 A1 ‡ | 5/2008 | Kumar | ............... | H01J 37/32422 216/44 |
| 2008/0135518 A1 ‡ | 6/2008 | Chen | ................ | H01J 37/32091 216/67 |
| 2008/0178805 A1 ‡ | 7/2008 | Paterson | ........... | H01J 37/32091 118/723 I |
| 2009/0015160 A1 ‡ | 1/2009 | Rueger | ................ | H01J 9/02 313/58 |
| 2009/0095714 A1 * | 4/2009 | Chen | ................ | H01J 37/321 216/67 |
| 2009/0236314 A1 * | 9/2009 | Chen | ................ | H01J 37/32091 216/67 |
| 2010/0000964 A1 ‡ | 1/2010 | Chen | ................ | B81C 1/00619 216/13 |
| 2010/0025371 A1 ‡ | 2/2010 | Cho | ................ | G03F 7/427 216/67 |
| 2011/0177694 A1 ‡ | 7/2011 | Chen | ................ | H01J 37/321 438/710 |
| 2011/0199027 A1 ‡ | 8/2011 | Kim | ................ | H01J 37/077 315/37 |
| 2012/0258555 A1 ‡ | 10/2012 | Holland | ............ | H01J 37/32596 438/5 |
| 2012/0258606 A1 ‡ | 10/2012 | Holland | ............ | H01J 37/32357 438/79 |
| 2012/0258607 A1 ‡ | 10/2012 | Holland | ............ | H01J 37/32357 438/798 |
| 2013/0098873 A1 ‡ | 4/2013 | Ramaswamy | .... | H01J 37/32091 216/67 |
| 2013/0160795 A1 * | 6/2013 | Xiao | ................ | H01J 37/321 134/1.2 |
| 2014/0265846 A1 ‡ | 9/2014 | Zhao | ................ | H01J 37/32357 315/98 |
| 2014/0265855 A1 ‡ | 9/2014 | Dorf | ................ | H01J 37/3233 315/11 |
| 2014/0283746 A1 * | 9/2014 | Seo | ................ | C23C 16/505 118/723 R |
| 2015/0170924 A1 ‡ | 6/2015 | Nguyen | ............... | H01J 37/3244 438/710 |
| 2017/0213747 A9 ‡ | 7/2017 | Dhindsa | ............ | H01L 21/3065 |

FOREIGN PATENT DOCUMENTS

| | | | |
|---|---|---|---|
| KR | 100895630 B1 ‡ | 5/2009 | |
| KR | 100895630 B1 | 5/2009 | |

\* cited by examiner
‡ imported from a related application

PLASMA PROCESSING SYSTEM, ELECTRON BEAM GENERATOR, AND METHOD OF FABRICATING SEMICONDUCTOR DEVICE

CROSS-REFERENCE TO RELATED APPLICATION

This U.S. non-provisional patent application is a divisional of U.S. patent application Ser. No. 15/870,800, filed on Jan. 12, 2018, which claims priority under 35 U.S.C. § 119 to Korean Patent Application No. 10-2017-0137423, filed on Oct. 23, 2017, in the Korean Intellectual Property Office, the disclosure of which is incorporated by reference herein in its entirety.

TECHNICAL FIELD

The present inventive concept relates to a plasma processing system, an electron beam generator and a method of fabricating a semiconductor device.

DISCUSSION OF RELATED ART

Semiconductor devices are fabricated by using various unit processes. The unit processes include a deposition process, a lithography process, and an etching process. The deposition process and the etching process may be performed using plasma. The plasma is used to treat a substrate.

SUMMARY

According to an exemplary embodiment of the present inventive concept, a plasma processing system is provided as follows. A chamber has an upper housing and a lower housing and receives a reaction gas. A first plasma source includes electron beam sources providing electron beams into the upper housing to generate an upper plasma. A second plasma source includes holes generating a lower plasma within the holes connecting the upper housing and the lower housing. Radicals of the upper plasma, radicals of the lower plasma, and ions of the lower plasma are provided, through the holes, to the lower housing so that the lower housing has radicals and ions at a predetermined ratio of the ions to the radicals in concentration. The second plasma source divides the chamber into the upper housing and the lower housing. A wafer chuck is positioned in the lower housing to receive a wafer.

According to an exemplary embodiment of the present inventive concept, an electron beam generator generating a plurality of electron beams is provided as follows. A plurality of electron beam sources are disposed at a first radius from a center of the electron beam source and at a second radius from the center, the second radius being greater than the first radius. Each of the plurality of electron beam sources generating one of the plurality of electron beams includes a source housing having a hollow inside and an opening and receiving a source gas, an RF power generating a source plasma from the source gas in the hollow inside of the source housing, the source plasma including a plurality of electrons, and a source electrode having an aperture, the source electrode being configured to cause to extract, through the opening of the source housing, the plurality of electrons from the source plasma of the source housing and accelerate the plurality of electrons extracted from the source plasma to travel away from the opening of the source housing.

According to an exemplary embodiment of the present inventive concept, a method of fabricating a semiconductor device on a wafer is provided as follows. An upper plasma using an electron beam is generated. A plurality of lower plasma are generated using an RF power. The plurality of lower plasmas are spaced apart from each other. A reaction plasma is formed on the wafer from the upper plasma and the plurality of lower plasmas. The reaction plasma has radicals and ions in a predetermined ratio of the ions to the radicals in concentration, The forming of the reaction plasma includes providing radicals of the upper plasma and radicals of the plurality of lower plasmas to the reaction plasma, providing ions of the plurality of lower plasmas to the reaction plasma, and blocking ions of the upper plasma from being provided to the reaction plasma.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
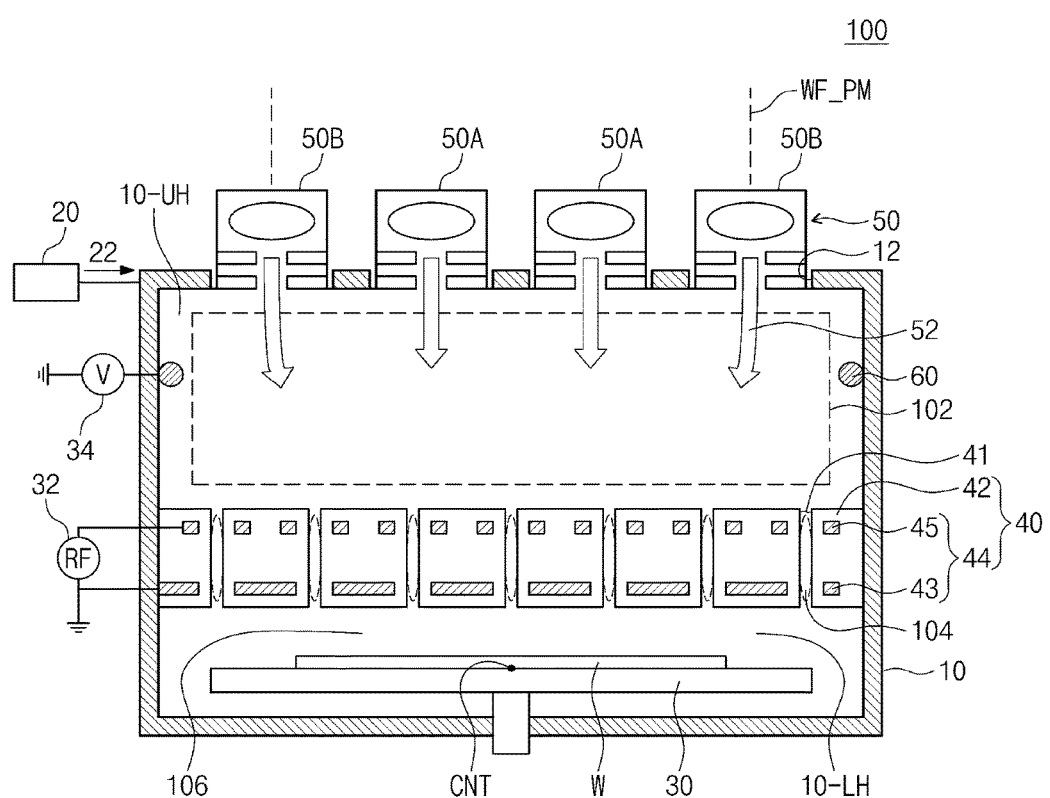
FIG. 1 is a diagram schematically illustrating a plasma processing system according to an exemplary embodiment of the present inventive concept.

Exemplary embodiments of the present inventive concept will be described below in detail with reference to the accompanying drawings. However, the inventive concept may be embodied in different forms and should not be construed as limited to the embodiments set forth herein. In the drawings, the thickness of elements, the size of the elements and regions where the elements are positioned may be exaggerated for clarity. Like reference numerals may refer to the like elements throughout the specification and drawings.

FIG. 1 is a diagram schematically illustrating a plasma processing system 100 according to an exemplary embodiment of the present inventive concept.

Referring to FIG. 1, the plasma processing system 100 may generate plasma using an electron beam. The plasma processing system 100 may include a chamber 10, a gas supplying part 20, an electrostatic chuck 30, a hollow cathode 40, electron beam sources 50, and a confinement electrode 60. A substrate W may be disposed in the chamber 10. The gas supplying part 20 may supply a reaction gas 22 into the chamber 10. The substrate W may be loaded on the electrostatic chuck 30. The hollow cathode 40 may generate a lower plasma 104 within the hollow cathode 40. The following patent document Korean Patent Application No. 10-2017-0137420 and 10-2017-0137421 are hereby incorporated by reference regarding the configuration of the hollow cathode 40. In some embodiments, physical properties (e.g., energy or intensity) of the lower plasma 104 may be changed to control a ratio of ions to radicals in concentration, which are produced from the reaction gas 22, in a reaction plasma 106. The electron beam sources 50 may provide electron beams 52 directed to the hollow cathode 40, thereby generating an upper plasma 102 from the reaction gas 22. The confinement electrode 60 may concentrate the electron beams 52 in the upper plasma 102 so that the electron beams 52 may be guided toward the hollow cathode 40. Without the confinement electrode 60, electrons of the electron beams 52 may be scattered away toward walls of the chamber 10. The confinement electrode 60 may serve to guide or direct the electrons scattered away toward the hollow cathode 40 so that the electron beams 52 may have more collisions with the reaction gas 22. Hereinafter, the upper plasma 102 and the lower plasma 104 will be described in more detail below.

The chamber 10 may provide an isolated space for the substrate W. The chamber 10 may be configured to have a pressure of about $10^{-3}$ Torr. The chamber 10 may include a lower housing 10-LH and an upper housing 10-UH. If the lower housing 10-LH is separated from the upper housing 10-UH, the substrate W may be loaded on the electrostatic chuck 30 by a robot arm (not shown). Thereafter, the upper housing 10-UH and the lower housing 10-LH may be combined to each other to seal the chamber 10.

The gas supplying part 20 may be connected to the chamber 10. The gas supplying part 20 may supply the reaction gas 22 into a region of the chamber 10 located on the hollow cathode 40. For example, the reaction gas 22 may be provided into the upper housing 10-LH and the hollow cathode 40 through the upper housing 10-LH. The reaction gas 22 may contain an etching gas (e.g., $NF_3$, $CF_4$, HBr, HCl, $CCl_4$, $SF_6$, HF, $CH_3$, or $CH_4$), an inert gas (e.g., Ar or He), or a purge gas (e.g., $N_2$). In certain embodiments, the reaction gas 22 may contain a deposition gas (e.g., $SiH_4$ or $NH_3$).

The electrostatic chuck 30 may be placed in the lower housing 10-LH of the chamber 10. The electrostatic chuck 30 may hold the substrate W using an electrostatic force. Although not shown, the electrostatic chuck 30 may be coupled to a plasma power source so that ions entering a sheath formed on the wafer are accelerated toward the wafer. For example, the plasma power source may include a direct current (DC) power or an RF power.

The hollow cathode 40 may be disposed between the electrostatic chuck 30 and the electron beam sources 50. The hollow cathode 40 may be parallel to the electrostatic chuck 30 and the substrate W. The hollow cathode 40 may include a dielectric plate 42 and electrodes 44. In an exemplary embodiment, the dielectric plate 42 may be formed of an insulating material including ceramics such as $Al_2O_3$. The dielectric plate 42 may be a disk. The dielectric plate 42 may have cathode holes 41. In an exemplary embodiment, the cathode holes 41 may range from about 10 um to about 2 mm in diameter. The cathode holes 41 may allow the reaction gas 22 to be supplied onto the substrate W. For example, each of the cathode holes 41 may have a diameter ranging from about 10 μm to about 2 mm. The electrodes 44 may be provided in the dielectric plate 42. In some embodiments, the electrodes 44 may include lower electrodes 43 and upper electrodes 45. The lower plasma 104 may be generated from the reaction gas 22 in the cathode holes 41 using RF power supplied to the electrodes 44. A first power supplying unit 32 may provide the RF power to the reaction gas 22 confined within the cathode holes 41 through the lower electrodes 43 and the upper electrodes 45. The lower electrodes 43 may be biased with a ground, and the upper electrodes 45 may be coupled to the first power supplying unit 32. The RF power may have a frequency ranging from about 1 KHz to about 100 MHz. The energy of the lower plasma 104 may be dependent on the intensity of the RF power. If the energy of the lower plasma 104 is increased, radicals of the reaction gas 22 (e.g., F, N, H, Br, Cl, or C) generated within the cathode holes 41 may be decreased in concentration, and ions of the reaction gas 22 (e.g., $F^+$, $NF^{2+}$, $NF2^+$, $H^+$, $Br^+$, $Cl^+$, or $C^+$) generated within the cathode holes 41 may be increased in concentration. As the ratio of the ions over the radicals in concentration increases, the etching caused by the ions and the radicals may have more directionality and thus an etching depth of the substrate W may be increased. For the deposition, a deposition rate of a thin film to be deposited on the substrate W may depend on a ratio of the ions to the radicals in concentration.

The electron beam sources 50 may be arranged on the chamber 10. For example, the electron beam sources 50 may be provided in upper ports 12, respectively, of the chamber 10. The electron beam sources 50 may be arranged in a direction parallel to the dielectric plate 42. The electron beam sources 50 may provide the electron beams 52 in a direction perpendicular to the dielectric plate 42 and the electrostatic chuck 30. The electron beams 52 may be directed in the same direction as the cathode holes 41. The electron beams 52 may generate the upper plasma 102 from the reaction gas 22 on the dielectric plate 42. The energy of the upper plasma 102 may be dependent on the energy intensity of the electron beams 52.

The chamber 10 may be divided into the upper housing 10-UH and the lower housing 10-LH by the hollow cathode 40. The upper housing 10-UH may contain the upper plasma 102 having ions at a first ion concentration and radicals at a first radical concentration. The upper plasma 102 may be generated from the reaction gas 22 supplied into the upper housing 10-UH. The hollow cathode 40 may contain in the cathode holes 41 the lower plasma 104 having ions at a second ion concentration and radicals at a second radical concentration. The lower plasma 104 may be generated from the reaction gas 22 supplied into the cathode holes 41 through the upper housing 10-UH. The lower housing 10-UH may contain ions coming from the cathode holes 41 of the hollow cathode 40 and radicals coming from the cathode holes 41. The ions coming from the cathode holes 41 may be originated from the lower plasma 104. The ions of the upper plasma 102 may be repelled back into the upper plasma 102 due to a DC bias formed on the hollow cathode 40 by the first power supplying unit 32. In other words, the DC bias formed on the hollow cathode 40 may block the ions of the upper plasma 102 from being provided to the lower housing 10-LH. The radicals of the upper plasma may pass through the cathode holes 41. The ions of the lower plasma 104 and the radicals of the lower plasma 104 may be provided into the lower housing 10-LH. Accordingly, the lower housing 10-LH may contain radicals originated from both the upper plasma 102 and the lower plasma 104 and ions originated from the lower plasma 104 only. The concentration of the radicals in the lower housing 10-LH may be determined by the first radical concentration of the upper plasma 102 and the second radical concentration of the reaction plasma 106. The concentration of the ions in the lower housing 10-LH may be determined only by the second ion concentration of the lower plasma 104. Some ions of the upper plasma 102 may have a kinetic energy sufficient to overcome the DC bias formed on hollow cathode 40 by the first power supplying unit 32 so that they may pass through the cathode holes 41 to be provided into the lower housing 10-LH. However, the amount of the ions of the upper plasma 102 with such high kinetic energy may be very small compared to the second ion concentration of the lower plasma 104 so that it may be ignored in controlling the ratio of the ions to the radicals in concentration of the lower housing 10-LH to a predetermined ratio of the ions to the radicals in the lower housing 10-LH.

The lower housing 10-LH may contain a reaction plasma 106 having ions at a third ion concentration determined only by the second ion concentration of the lower plasma 104 and radicals at a third radical concentration determined by the first radical concentration of the upper plasma 102 and the second radical concentration of the lower plasma 104. The third ion concentration of the reaction plasma 106 may be also determined by a number of the cathode holes 41 or a width of each of the cathode holes 41. The third radical concentration of the reaction plasma 106 may be also determined by the number of the cathode holes 41 or the width of each of the cathode holes 41. In an exemplary embodiment, the ratio of the ions to the radicals in the reaction plasma 106 may be controlled by the RF power of the first power supplying unit 32, which may generate the lower plasma 104 in the cathode holes 41. For example, the RF power of the first power supplying unit 32 may be controlled so that the reaction plasma 106 may have a predetermined ratio of the ions to the radicals in the reaction plasma 106.

A first plasma source may include the electron beam sources 50. The hollow cathode 40 and the first power supplying unit 32 may be referred to as a second plasma source. The first power supplying unit 32 may be referred to as a first RF power. The cathode holes 41 may be referred to as a plurality of holes.

In an exemplary embodiment, the first power supplying unit 32 (or the first RF power) may be coupled to the upper electrodes 45 and a ground voltage may be coupled to the lower electrodes 43 so that the dielectric plate 42 has a positive DC bias to block the ions of the upper plasma 102 from being provided into the lower housing 10-LH through the cathode holes 41. In other words, the reaction plasma 106 need not include the ions of the upper plasma 102.

In an exemplary embodiment, the first power supplying unit 32 may provide an RF power of which frequency ranges from about 1 KHz to about 100 MHz.

In an exemplary embodiment, the electrostatic chuck 30 may have a center CNT that is vertically aligned with a center of an electron beam generator including the electron beam sources 50 having a plurality of first electron beam sources 50A and a plurality of second electron beam sources 50B. The first electron beam sources 50A may be positioned within a perimeter of the wafer W; and the second electron beam sources 50B may overlap the perimeter of the wafer W. The present inventive concept is not limited thereto. For example, the second electron beam sources 50B may be positioned outside the perimeter of the wafer W.

Figure 2:
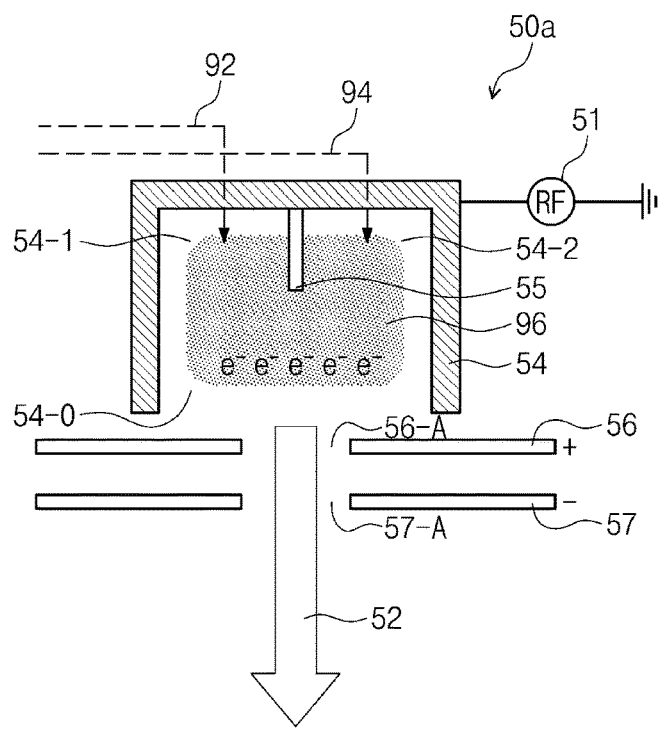
FIGS. 2 to 6 are diagrams illustrating exemplary electron beam sources of FIG. 1 according to the present inventive concept.

FIG. 2 illustrates an exemplary electron beam source of FIG. 1 according to the present inventive concept.

Referring to FIG. 2, an electron beam source 50a may include an RF power supplying unit 51, a source housing 54, a first grid electrode 56 and a second grid electrode 57. The source housing 54 may define a hollow inside and may have an opening 54-O. The RF power supplying unit 51 may be configured to provide a source RF power to the source housing 54. The source RF power may have a frequency ranging from about 1 KHz to about 1 MHz. The source RF power may generate a source plasma 96 having electrons e$^-$ from a first source gas 92 and a second source gas 94, in the source housing 54. The first source gas 92 may include helium (He). The second source gas 94 may include argon (Ar). The source housing 54 may have a vertical partition wall 55 that is erected vertically from an inside surface of the source housing 54 toward the opening 54-O of the source housing 54. The vertical partition wall 55 may divide an internal space of the source housing 54 in a lateral direction into a first divided internal space 54-1 and a second divided internal space 54-2. The first source gas 92 may be provided in the first divided internal space 54-1. The second source gas 94 may be provided in the second divided internal space 54-2. The first grid electrode 56 may be provided below the source housing 54. The second grid electrode 57 may be provided below the first grid electrode 56. The first grid electrode 56 may be interposed between the source housing 54 and the second grid electrode 57. The first grid electrode 56 may be biased with a positive voltage so that the first grid electrode 56 may serve to extract the electrons e$^-$ from the source plasma 96 in the hollow inside of the source housing 54 through the opening 54-O. The second grid electrode 57 may be biased with a negative voltage so that the second grid electrode 57 may accelerate the electrons e$^-$ extracted from the hollow inside of the source housing 54 through a first aperture 56-A of the first grid electrode 56 to form the electron beam 52. The electron beam 52 may be provided into the chamber 10 of FIG. 1 through a second aperture 57-A of the second grid electrode 57. The first grid electrode 56 may be referred to as a first source electrode; and the second grid electrode 57 may be referred to as a second source electrode. The RF power supplying unit 51 may be referred to as a second RF power.

In an exemplary embodiment, the opening 54-O of the source housing 54, the first aperture 56-A of the first grid electrode 56 and the second aperture 57-A of the second grid electrode 57 may be aligned along a traveling direction of the electron beam 52 so that the electrons of the electron beam 52 may pass from the source plasma 96 in the hollow inside of the source housing 54 to the upper housing 10-UH of the chamber 10.

In an exemplary embodiment, the first source electrode may be biased with a negative voltage to extract the electrons from the source plasma 96 in the hollow inside of the source housing 54 through the opening 54-O of the source housing 54 and the second source electrode may be biased with a positive voltage to accelerate the electrons passing through the first aperture 56-A of the first source grid electrode to output the electron beam through the second aperture 57-A to the upper housing 10-UH of the chamber 10.

In an exemplary embodiment, a source electrode may include the first grid electrode 56 with the first aperture 56-A and the second grid electrode 57 with the second aperture 57-A.

Figure 3:
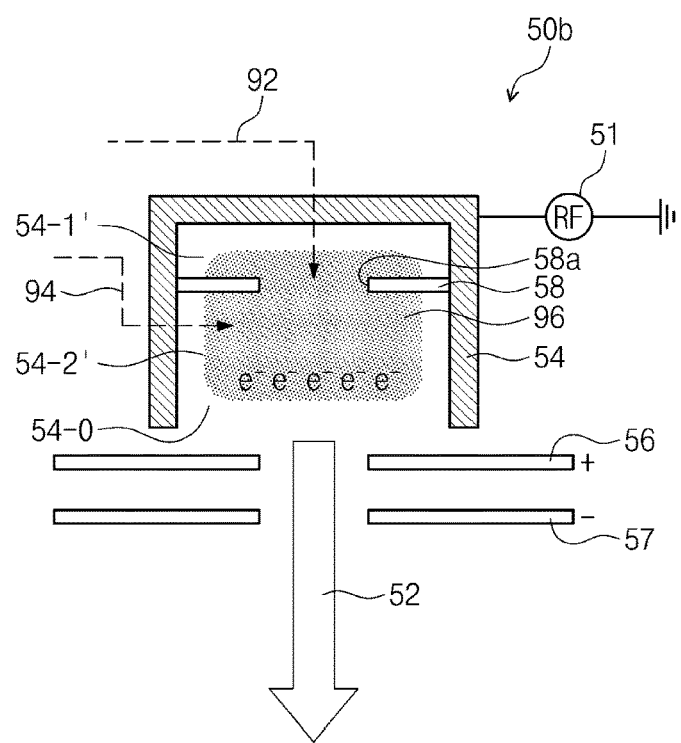

FIG. 3 illustrates an exemplary electron beam source of FIG. 1 according to the present inventive concept.

Referring to FIG. 3, an electron beam source 50b may include the source housing 54 with a horizontal partition wall 58. The RF power supplying unit 51, the first grid electrode 56 and second grid electrode 57 may be configured to have the same features as those of the previous example described with reference to FIG. 2. The horizontal partition wall 58 may divide the internal space of the source housing 54 in a vertical direction into a first divided internal space 54-1' and a second divided internal space 54-2'. The first divided internal space 54-1' may be an upper region of the source housing 54. The second divided internal space 54-2' may be a lower region of the source housing 54. The first source gas 92 may be provided into the first divided internal space 54-1'. The second source gas 94 may be provided into the second divided internal space 54-2'. The horizontal partition wall 58 may have a partition wall hole 58a. If the first source gas 92 passes through the partition wall hole 58a, it may be mixed with the second source gas 94 in the second divided internal space 54-2'. The source RF power may generate the source plasma 96 having the electrons e⁻ from the first source gas 92 and the second source gas 94.

In an exemplary embodiment, the horizontal partition wall 58 may have the partition wall hole 58a. The partition wall may be disposed horizontally in the hollow inside of the source housing 54 with the partition wall hole 58a facing the opening 54-O of the source housing 54.

Figure 4:
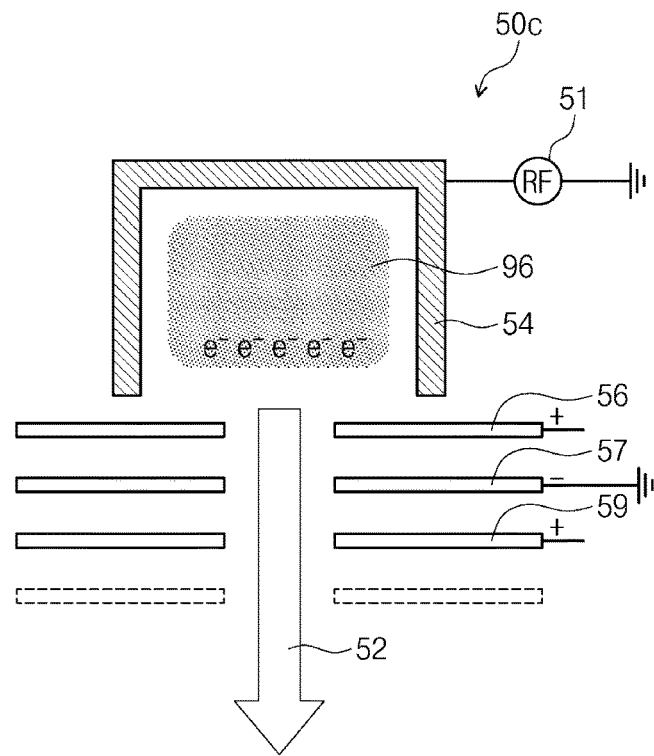

FIG. 4 illustrates an exemplary electron beam source of FIG. 1 according to the present inventive concept.

Referring to FIG. 4, an electron beam source 50c may further include a third grid electrode 59 other than the first grid electrode 56 and the second grid electrode 57 described with reference to FIG. 2 or 3. The RF power supplying unit 51, the first grid electrode 56 and the second grid electrode 57 may be configured to have the same features as those of the previous example described with reference to FIG. 2 or FIG. 3. The third grid electrode 59 may be provided below the second grid electrode 57 and may serve to further accelerate the electron beam 52. The velocity of the electron beam 52 may be determined by a magnitude of an acceleration voltage in the third grid electrode 59. Although not shown, the electron beam source 50c may further include fourth to n-th grid electrodes. The source housing 54 may be provided on the first grid electrode 56, as shown in FIG. 2 or 3. The source plasma 96 having the electrons e⁻ may be generated in the source housing 54b. Unlike FIG. 2 or 3, the source housing 54 need not have a partition dividing the source housing 54 vertically or laterally.

Figure 5:
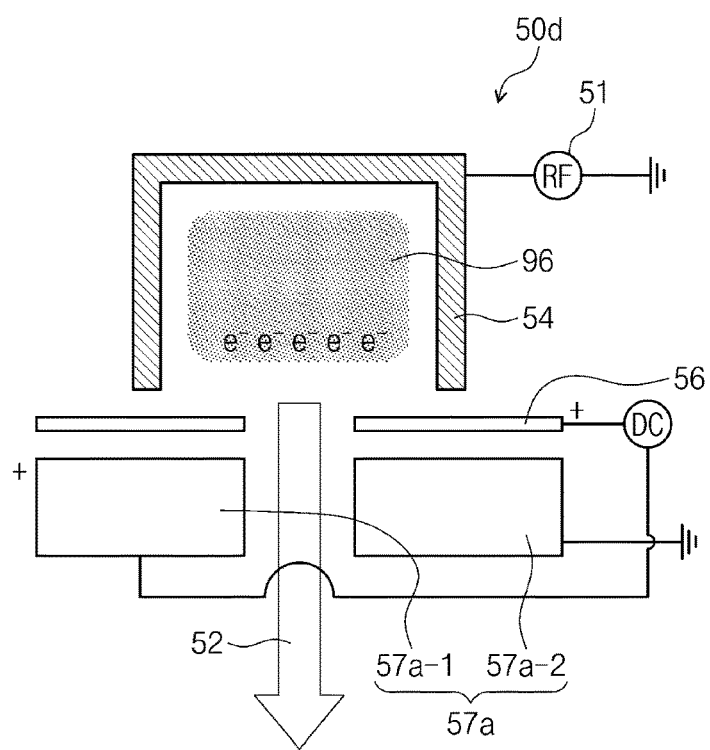

FIG. 5 illustrates an exemplary electron beam source of FIG. 1 according to the present inventive concept.

Referring to FIG. 5, an electron beam source 50d may include a block electrode 57a including a first sub-electrode 57a-1 and a second sub-electrode 57a-2. The RF power supplying unit 51, the source housing 54, and the first grid electrode 56 may be configured to have the same features as those of the previous examples described with reference to FIGS. 2 to 4. The block electrode 57a may be provided below the first grid electrode 56. The block electrode 57a may be provided at a position of the second grid electrode 57 of FIG. 2 and may be separated from each other. The block electrode 57a may be referred to as a second grid electrode or a second source electrode. The block electrode 57a may be individually biased. For example, the second sub-electrode 57a-2 may be grounded, and the first sub-electrode 57a-1 may be biased with a positive voltage. The block electrode 57a may be configured to deflect the electron beam 52.

Figure 6:
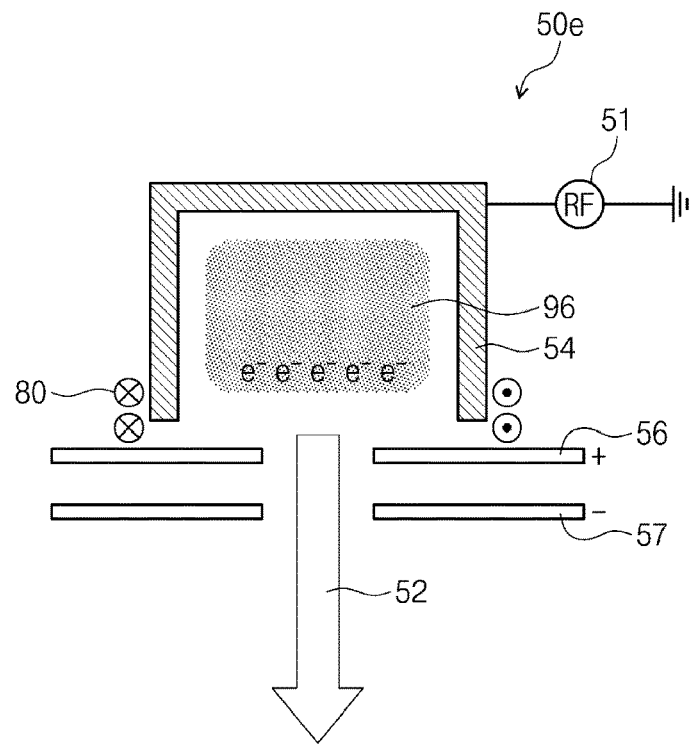

FIG. 6 illustrates an exemplary electron beam source of FIG. 1 according to the present inventive concept.

Referring to FIG. 6, an electron beam source 50e may include a source coil 80. The RF power supplying unit 51, the source housing 54, the first grid electrode 56 and the second grid electrode 57 may be configured to have the same features as those of the previous examples described with reference to FIGS. 2 to 4. The source coil 80 may be provided on an outer circumference surface of the source housing 54. The source coil 80 may separate the electrons e⁻ from the source plasma 96 in the source housing 54.

Referring back to FIG. 1, the confinement electrode 60 may be provided on an inner side surface of the chamber 10 and between the electron beam sources 50 and the hollow cathode 40. A voltage supplying unit 34 may apply a bias voltage V to the confinement electrode 60. The bias voltage V may electrically control the upper plasma 102 or the electron beams 52, which are adjacent to the confinement electrode 60. The bias voltage V may be a DC voltage. The bias voltage V may range from about −1 V to about 1 KV. If the bias voltage V is negative, the electron beams 52 adjacent to the inner side surface of the chamber 10 may be deflected in a direction away from the confinement electrode 60. If the bias voltage V is positive, the upper plasma 102 may move away from the confinement electrode 60 and the electron beams 52 may be deflected in a direction toward the confinement electrode 60.

Figure 7:
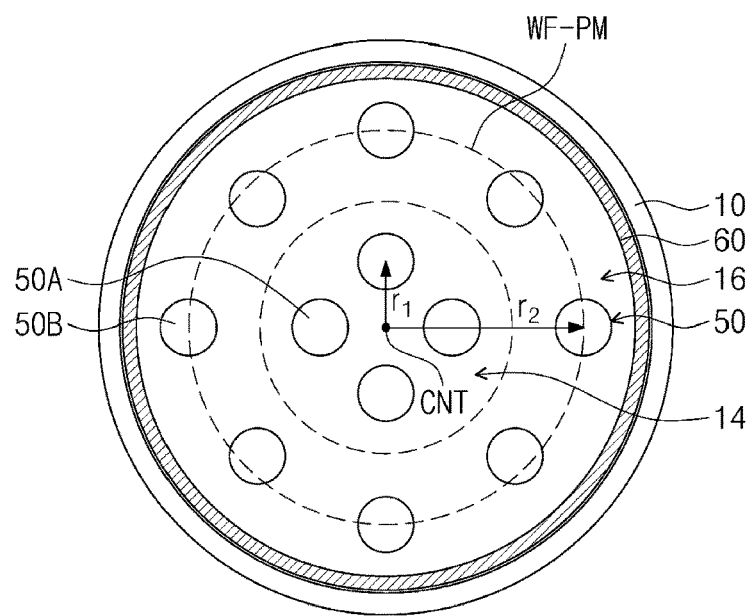
FIGS. 7 and 8 are plan views illustrating an exemplary confinement electrode of FIG. 1 according to the present inventive concept.

FIG. 7 illustrates an exemplary confinement electrode 60 of FIG. 1 according to the present inventive concept.

Referring to FIGS. 1 and 7, the confinement electrode 60 may be a ring-shaped structure extending along the inner side surface of the chamber 10. The confinement electrode 60 may have a circular, rectangular, or ring-shaped section. When viewed in a plan view, the electron beam sources 50 may be provided within the confinement electrode 60. The confinement electrode 60 may serve to concentrate the electron beams 52 within a center region 14 of the chamber 10 or the hollow cathode 40 using the bias voltage V. The electron beams 52 near an edge region 16 of the chamber 10 may be deflected toward the center region 14 by the bias voltage V applied to the confinement electrode 60.

Figure 8:
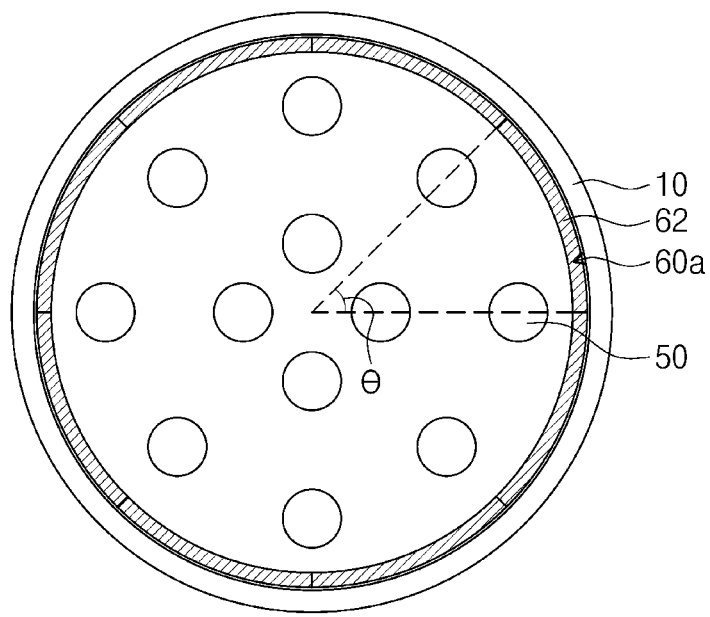

Referring to FIGS. 1 and 8, the electron beam sources 50 may include a plurality of first electron beam sources 50A and a plurality of second electron beam sources 50B. The first electron beam sources 50A may be disposed within a perimeter W-PM of the wafer W if placed on the electrostatic chuck 30. The electrostatic chuck 30 may be referred to as a wafer chuck. The second electron beam sources 50B may overlap the perimeter W-PM of the wafer W if placed on the electrostatic chuck 30 or may be disposed outside of the perimeter W-PM of the wafer W if placed on the electrostatic chuck 30. A number of the first electron beam sources 50A may be smaller than a number of the second electron beam sources 50B. The first electron beam sources 50A are equally positioned from a center CNT of the electrostatic chuck 30 (or a center of the wafer chuck).

In an exemplary embodiment, an electron beam generator may include the electron beam sources 50 disposed at a first radius r1 from a center of the electron beam generator, and at a second radius r2 from the center of the electron beam generator, the second radius r2 being greater than the first radius r1. The center of the electron beam generator may coincide with the center CNT of the wafer chuck. The electron beam sources 50 having the first electron beam sources 50A and the second electron beam sources 50B that are concentrically arranged may be referred to as the electron beam generator. The first electron beam sources 50 and the second electron beam sources 50 may be concentrically arranged around the center CNT of the wafer chuck 30 or the center of the electron beam generator.

FIG. 8 illustrates an exemplary confinement electrode 60 of FIG. 1 according to the present inventive concept.

Referring to FIGS. 1 and 8, the confinement electrode 60a may include plurality of electrode sectors 62. The electrode sectors 62 may be arranged along the inner side surface of the chamber 10 to form a circular shape. The confinement electrode 60a may include eight electrode sectors 62, for example, as shown in FIG. 8. Each of the electrode sectors 62 may have an azimuth angle θ of about 45°. The electrode sectors 62 may be connected to the voltage supplying unit 34. The voltage supplying unit 34 may independently supply the bias voltage V to each of the electrode sectors 62. The electron beams 52 each may be individually controlled in at least one of the electrode sectors 62. Each electrode sector may be separated at a unit of the azimuth angle θ.

Figure 9:
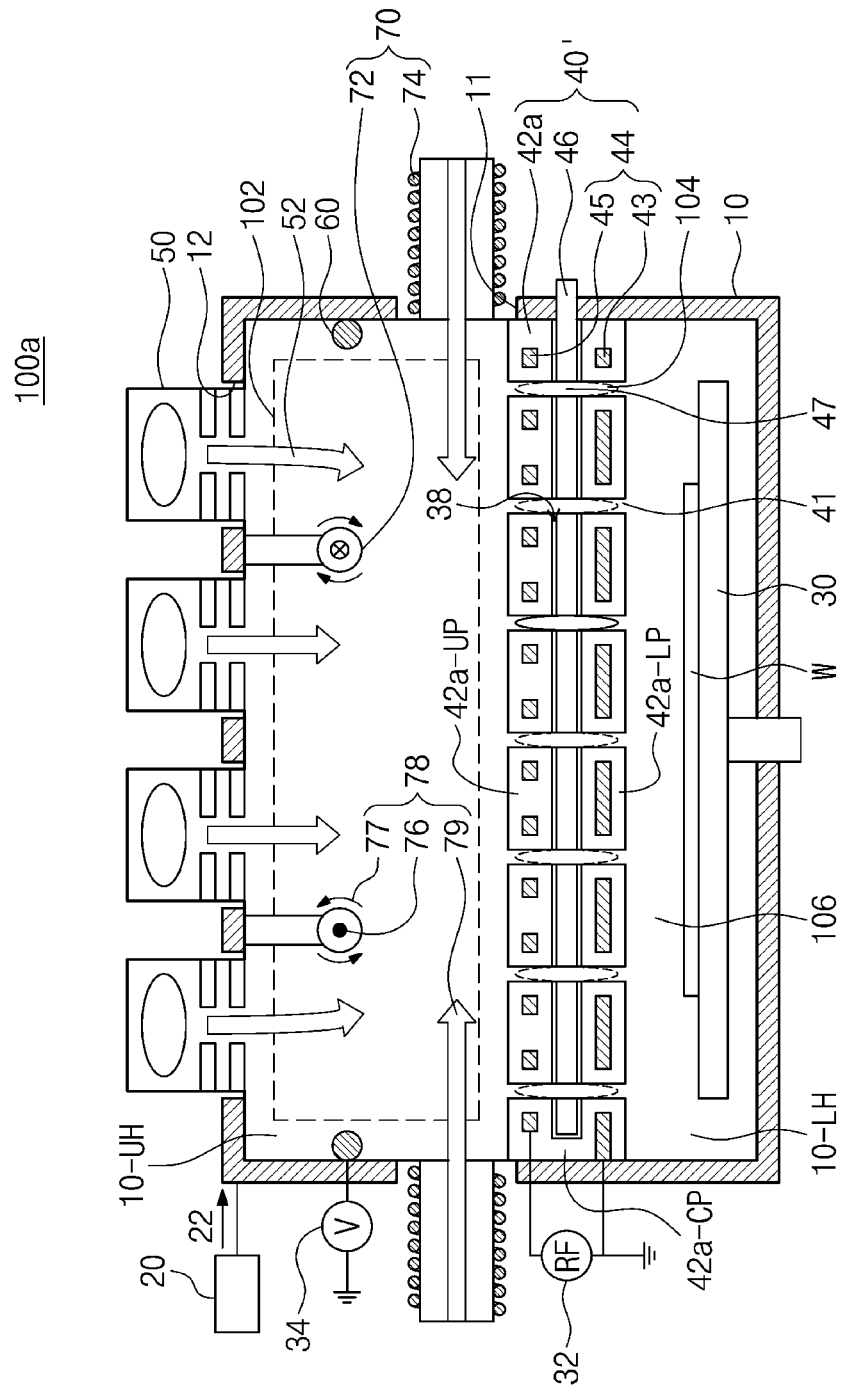
FIGS. 9 and 10 are diagrams illustrating a plasma processing system according to an exemplary embodiment of the present inventive concept.
Figure 10:
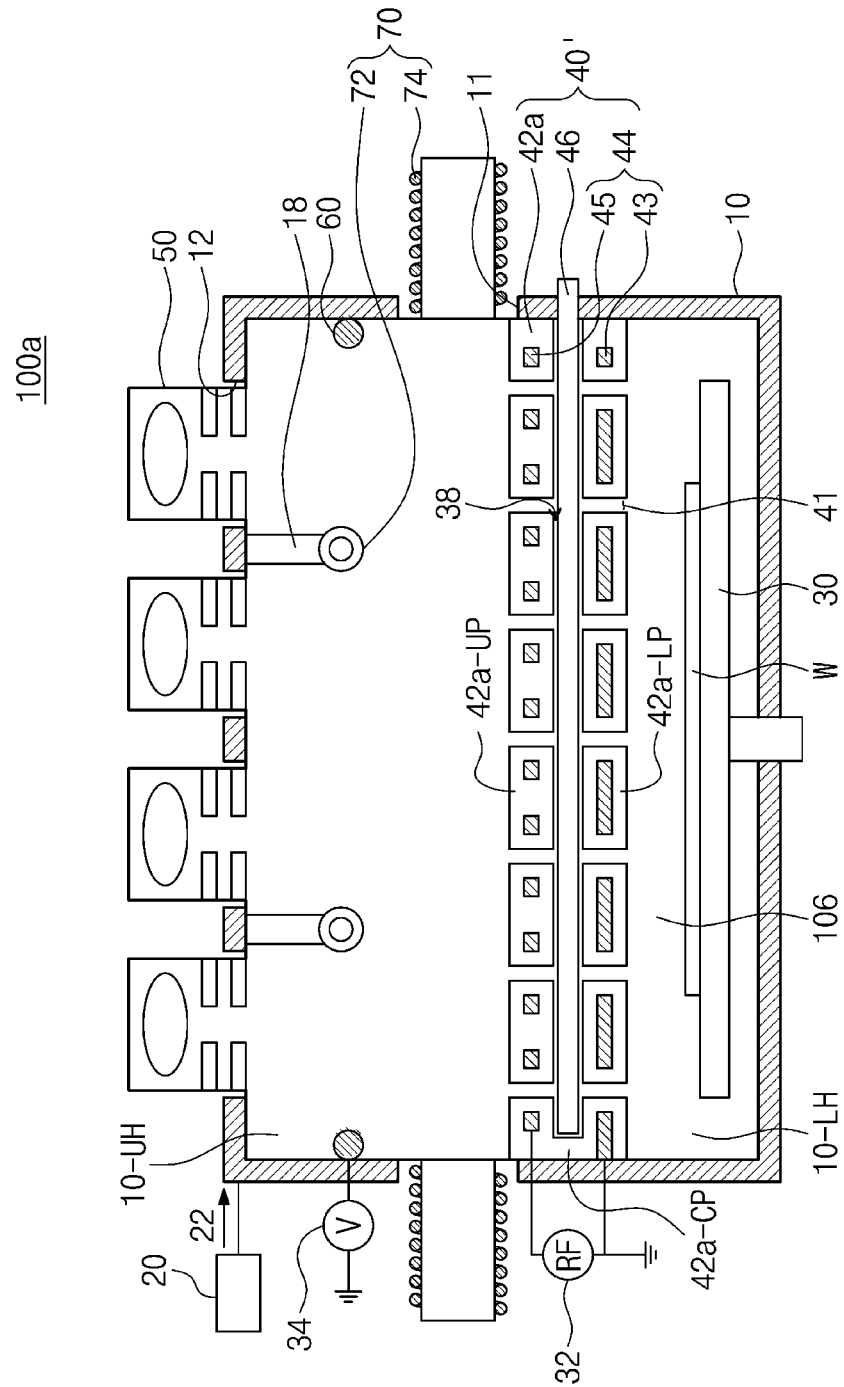

FIGS. 9 and 10 illustrate a plasma processing system according to an exemplary embodiment of the present inventive concept.

Referring to FIG. 9, the plasma processing system 100a may include magnetic coils 70 and a shutter plate 46 in a hollow cathode 40'. The chamber 10, the gas supplying part 20, the electrostatic chuck 30, the electron beam sources 50, and the confinement electrode 60 may be configured to have the same features as those of the previous examples described with reference to FIGS. 1 to 7.

The magnetic coils 70 may produce an electromagnetic field 78 in the chamber 10. The electromagnetic field 78 may deflect the electron beams 52. For example, the electromagnetic field 78 may concentrate the upper plasma 102 from the edge region 16 toward the center region 14 or disperse the upper plasma 102 from the center region 14 toward the edge region 16 of the chamber 10. (See also FIG. 7). The electromagnetic field 78 may also prevent the electron beams 52 from passing through the cathode holes 41. In the case where the electron beams 52 pass through the cathode holes 41, the substrate W may be damaged by the upper plasma 102.

Figure 11:
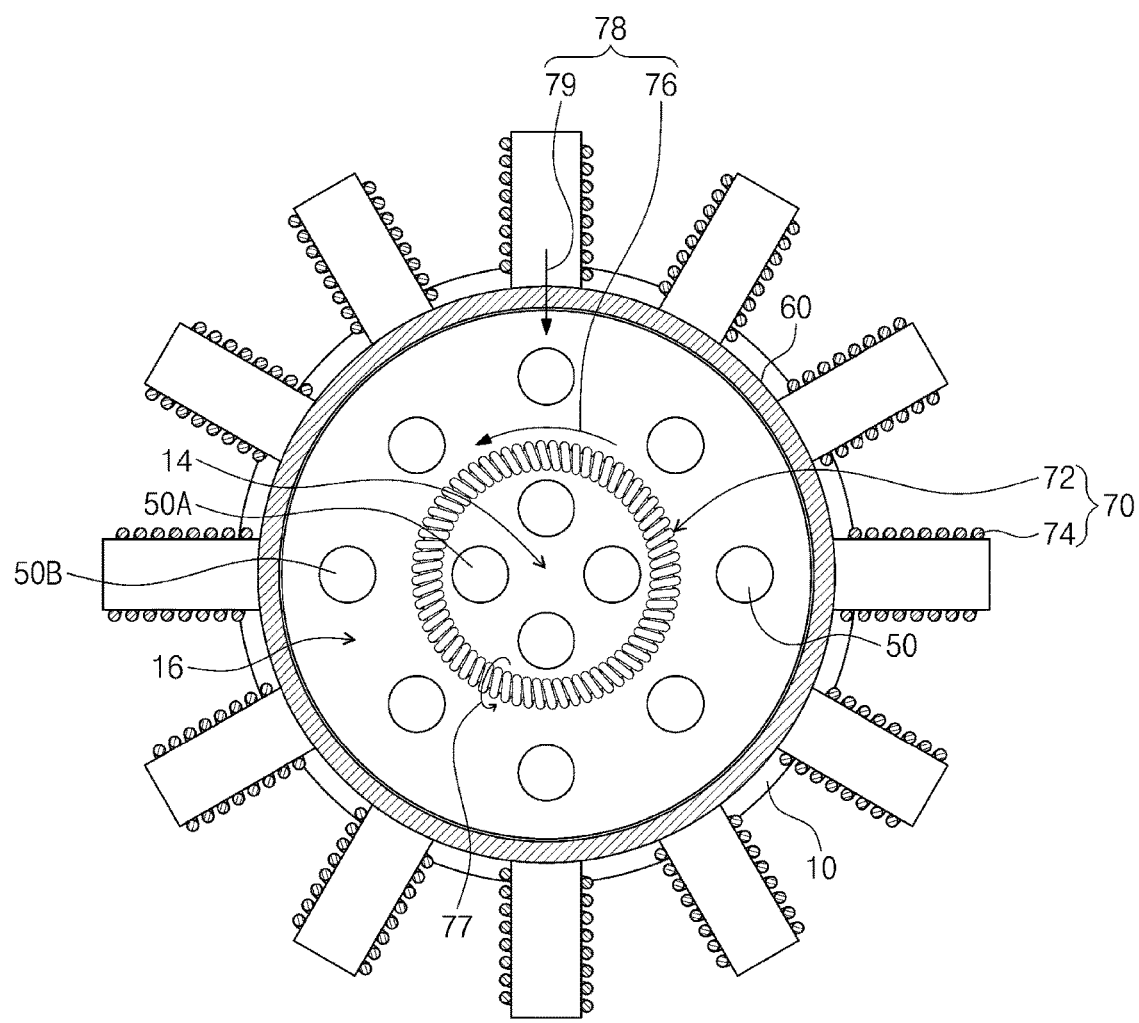
FIG. 11 is a plan view illustrating an exemplary magnetic coil of FIG. 9 according to the present inventive concept.

FIG. 11 illustrates exemplary magnetic coils 70 of FIG. 9 according to the present inventive concept.

Referring to FIGS. 9 to 11, the magnetic coils 70 may include an inner coil 72 and outer coils 74.

The inner coil 72 may be provided in the confinement electrode 60. When viewed in a plan view, the inner coil 72 may be provided to have a circular shape. In addition, the inner coil 72 may define the center region 14 and the edge region 16 of the chamber 10. For example, the center region 14 may be defined as an inner region of the inner coil 72, whereas the edge region 16 may be defined as an outer region of the inner coil 72.

The inner coil 72 may be supported by a supporter 18, which is provided in the chamber 10. The supporter 18 may be a structure extending from an upper inner surface of the chamber 10, which is located between the electron beam sources 50, toward an internal space of the confinement electrode 60. The inner coil 72 may control differently an intensity of the electron beams 52 at the center region 14 of the chamber 10 and at the edge region 16 of the chamber 10.

The inner coil 72 may induce an internal magnetic field 76 and an internal electric field 77. The internal magnetic field 76 may be induced along the inner coil 72 or in a circular shape. The internal electric field 77 may be induced in a winding direction of the inner coil 72. Directions or intensities of the internal magnetic field 76 and the internal electric field 77 may be controlled by the bias voltage V of the confinement electrode 60. For example, in the case where the bias voltage V is negative, the internal magnetic field 76 may be induced in a counterclockwise direction. The bias voltage V having a negative value may concentrate the electron beams 52 toward the center region 14 of the chamber 10 or the hollow cathode 40'. The velocity of the electron beams 52 may be lower at the edge region 16 than at the center region 14. The intensity of the internal magnetic field 76 in the chamber 10 may become non-uniform. The inner coil 72 may induce the internal magnetic field 76 in the counterclockwise direction, and this may allow the electron beams 52 to have uniform intensities at the center region 14 and the edge region 16 of the chamber 10 or the hollow cathode 40'. In the case where the inner coil 72 induces the internal magnetic field 76 in the counterclockwise direction, the electron beams 52 in the inner coil 72 may be decelerated by the internal electric field 77. The electron beams 52 outside the inner coil 72 may be accelerated by the internal electric field 77. Accordingly, it may be possible to improve uniformity in intensity of the electron beams 52 in the chamber 10. Nevertheless, the present inventive concept is not limited to thereto. In the case where the bias voltage V is positive, the internal magnetic field 76 may be induced in a clockwise direction.

The outer coils 74 may be provided outside the chamber 10. For example, the outer coils 74 may be provided in side ports 11 of the chamber 10. The outer coils 74 may provide external magnetic fields 79 in the chamber 10. The external magnetic fields 79 may be provided in a direction perpendicular to the propagation direction of the electron beams 52. If the propagation direction of the electron beams 52 is normal to an upper surface of the dielectric plate 42, the external magnetic fields 79 may be provided in a direction parallel to the upper surface of the dielectric plate 42. The external magnetic fields 79 may deflect the electron beams 52. The external magnetic fields 79 may prevent the electron beams 52 from being incident on the cathode holes 41. The number of the outer coils 74 may be the same as that of the electron beam sources 50. For example, twelve electron beam sources 50 and twelve outer coils 74 may be provided. Although not shown, the external magnetic fields 79 may be provided to correspond to the electron beams 52 in a one-to-one manner. The outer coils 74 may be configured to allow the external magnetic fields 79 to aim the electron beams 52 individually.

Referring to FIG. 1 and FIGS. 7 to 11, the confinement electrode 60 may be in the upper housing 10-UH of the chamber 10 to apply the bias voltage V supplied from the voltage supplying unit 34 to control a deflection direction of the electron beams 52.

In an exemplary embodiment, the confinement electrode 60a may include the electrode sectors 62. The electrode sectors 62 of the confinement electrode 60a may be biased independently with the bias voltage V to control the deflection direction of the electron beams 52.

In an exemplary embodiment, the inner coil 72 may be disposed in the upper housing 10-UH of the chamber 10 to generate the internal magnetic field 76.

In an exemplary embodiment, the inner coil 72 and the confinement electrode 60 may be positioned at substantially the same height from an upper surface of the electrostatic chuck 30.

In an exemplary embodiment, the bias voltage V applied to the confinement electrode 60 may control the internal magnetic field in intensity or direction. In an exemplary embodiment, the electron beam sources 50 may include the first electron beam sources 50A overlapped with an inner region of the inner coil 72, and the second electron beam sources 50B overlapped with an outer region of the inner coil 72.

The outer coils 74 may be attached to the chamber 10 to provide the external magnetic fields 79 to the upper plasma 102 in a direction crossing the traveling direction of the electron beams 52. Referring to FIGS. 9 and 10, the hollow cathode 40' may include the shutter plate 46. The dielectric plate 42a of the hollow cathode 40' may have a gap 38 between the lower electrodes 43 and the upper electrodes 45. The shutter plate 46 may be provided in the gap 38. The dielectric plate 42a may include an upper plate 42a-UP surrounding the upper electrodes 45, a lower plate 42a-LP surrounding the lower electrodes 43 and a connecting plate 42a-CP connecting an end of the upper plate 42a-UP and an end of the lower plate 42a-LP. The upper plate 42a-UP, the lower plate 42a-LP and the connecting plate 42a-CP may define the gap 38 of the dielectric plate 42a to receive the shutter plate 46.

However, the present inventive concept is not limited thereto. For example, the connecting plate 42a-CP may be omitted so that the dielectric plate 42a may include a lower plate and an upper plate only, and the shutter plate 46 may be provided between the lower plate and the upper plate of the dielectric plate 42a.

Figure 12:
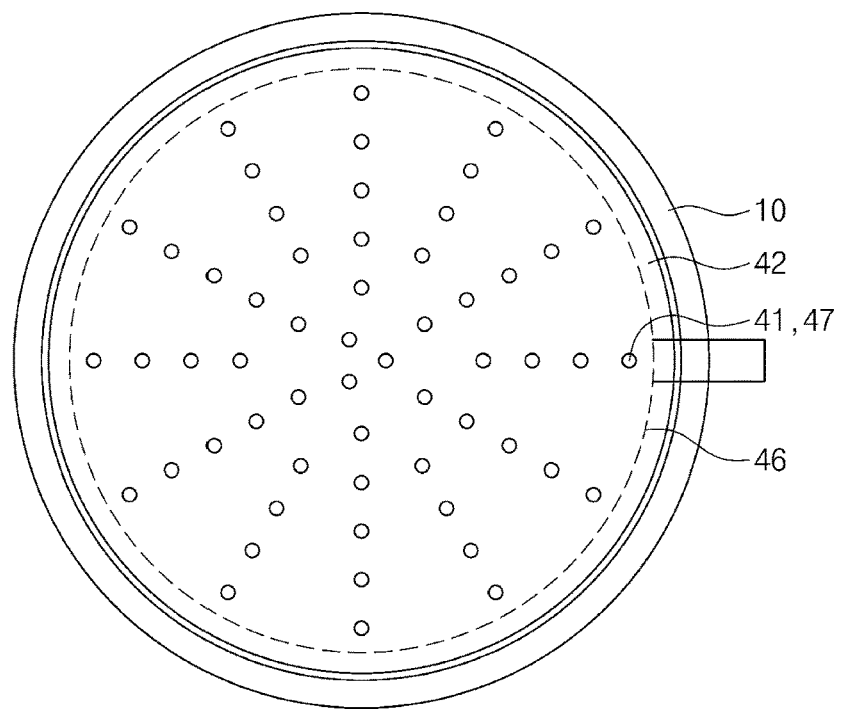
FIGS. 12 and 13 are plan views showing a change in open state of cathode holes, which is caused by rotation of a shutter plate of FIGS. 9 and 10, according to an exemplary embodiment of the present inventive concept.
Figure 13:
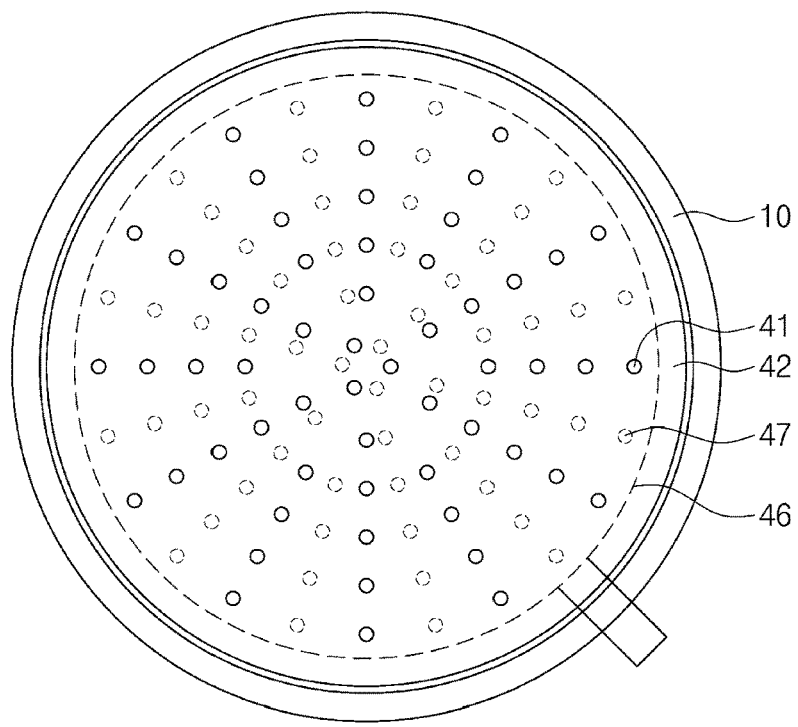

FIGS. 12 and 13 are plan views showing a change in open state of the cathode holes 41 of the dielectric plate 42a, which occurs when the shutter plate 46 of FIGS. 9 and 10 is rotated, according to an exemplary embodiment of the present inventive concept.

Referring to FIGS. 9, 10, 12, and 13, the shutter plate 46 may be configured to move or rotate in the gap 38. In some embodiments, the shutter plate 46 may have shutter holes 47. The shutter holes 47 may be aligned to the cathode holes 41. The shutter holes 47 may have substantially the same diameter as that of the cathode holes 41.

Referring to FIGS. 9 and 12, if the cathode holes 41 are aligned to the shutter holes 47, the lower plasma 104 may be generated in the cathode holes 41 and the shutter holes 47. In some embodiments, physical properties (e.g., energy or intensity) of the lower plasma 104 may be changed to control a ratio of ions to radicals, produced from the reaction gas 22, in the reaction plasma 106. If the intensity of the lower plasma 104 is increased, the number or density of the ions may be larger than that of the radicals in the reaction plasma 106. The ratio of the ions to the radicals may be increased. If the intensity of the lower plasma 104 is decreased, the number or density of the ions may be less than that of the radicals in the reaction plasma 106. The ratio of the ions to the radicals may be decreased.

Referring to FIGS. 10 and 13, the shutter plate 46 may be rotated in the gap 38, thereby closing the cathode holes 41. The shutter holes 47 and the cathode holes 41 may be off-centered with respect to each other. In this case, the shutter plate 46 may shut off the reaction gas 22. The lower plasma 104 of FIG. 9 may be removed.

The plasma processing system may be used in a process of fabricating a semiconductor device, as will be described below.

Figure 14:
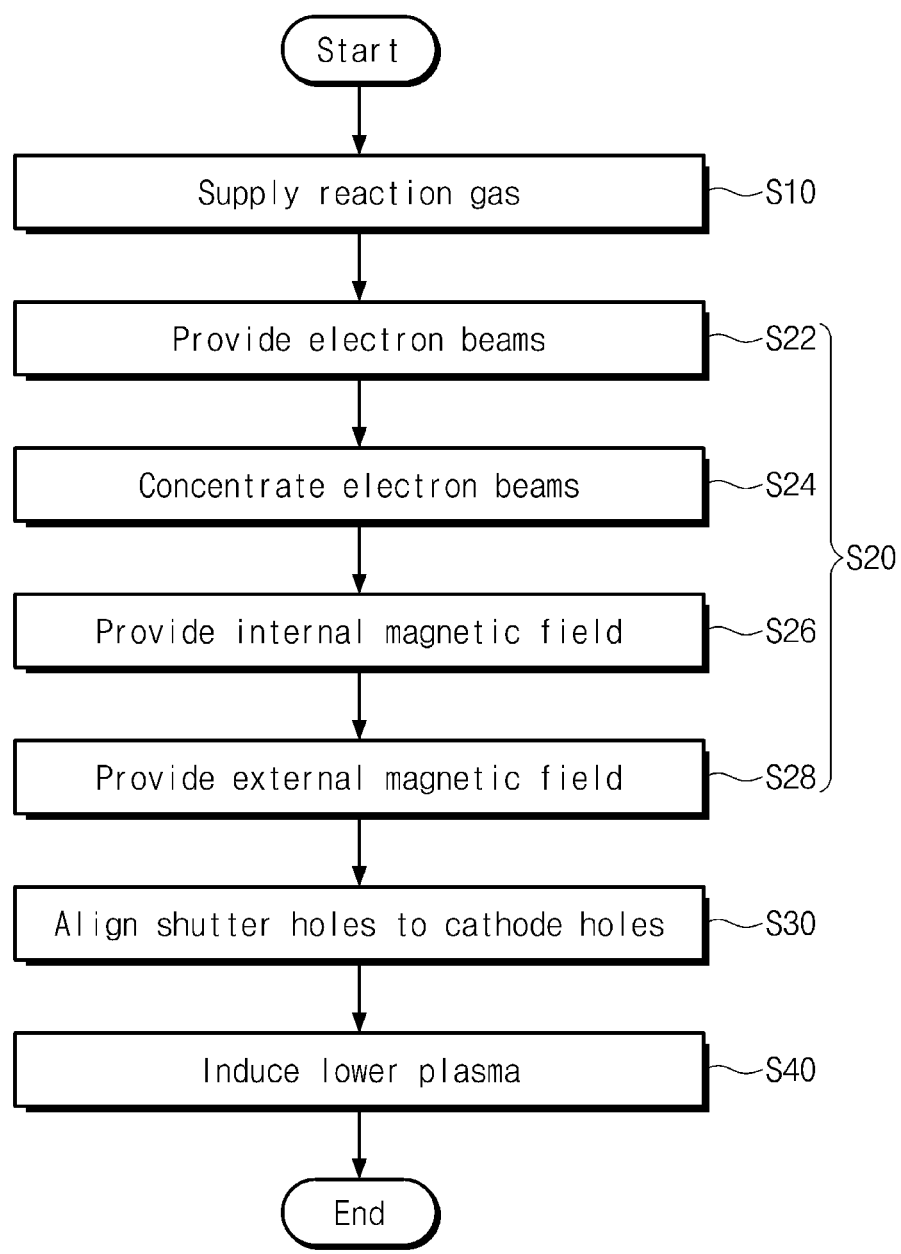
FIG. 14 is a flow chart illustrating a method of fabricating a semiconductor device, according to an exemplary embodiment of the present inventive concept.

FIG. 14 is a flow chart illustrating a method of fabricating a semiconductor device, according to an exemplary embodiment of the present inventive concept.

Referring to FIG. 14, a method of fabricating a semiconductor device may include supplying the reaction gas 22 (in S10), inducing the upper plasma 102 (in S20), aligning the shutter holes 47 to the cathode holes 41 (in S30), and inducing the lower plasma 104 (in S40).

Referring to FIGS. 1, 9, and 14, if the substrate W is loaded on the electrostatic chuck 30, the reaction gas 22 in the gas supplying part 20 may be supplied into the upper housing 10-UH of the chamber 10 located on the hollow cathode 40 (in S10). The reaction gas 22 may be or include an etching gas, a deposition gas, an inert gas, or a purge gas.

Thereafter, the electron beams 52 from the electron beam sources 50 may generate the upper plasma 102 (in S20). In an exemplary embodiment, the generating of the upper plasma 102 (in S20) may include providing the electron beams 52 (in S22), concentrating the electron beams 52 (in S24), providing the internal magnetic field 76 (in S26), and providing the external magnetic field 79 (in S28).

The electron beam sources 50 may provide the electron beams 52 in a direction perpendicular to the hollow cathode 40 (in S22). The electron beams 52 may produce the upper plasma 102 from the reaction gas 22.

The confinement electrode 60 may concentrate the electron beams 52 within the center region 14 of the chamber 10 or the hollow cathode 40 using the bias voltage V (in S24). For example, the substrate W may be provided in the center region 14 of the chamber 10 or the hollow cathode 40. If the bias voltage V is negative, the electron beams 52 may be concentrated near the center region 14. By contrast, if the bias voltage V is positive, the electron beams 52 may be concentrated near the edge region 16 of the chamber 10 or the hollow cathode 40.

The inner coil 72 may exert the internal magnetic field 76 on the electron beams 52 to uniformly control the intensity of the electron beams 52 (in S26). The internal magnetic field 76 may cause a difference in intensity of the electron beams 52 at the edge region 16 and at the center region 14 of the chamber 10 or the hollow cathode 40. The electron beams 52 may be accelerated at the edge region 16 and may be decelerated at the center region 14.

The outer coils 74 may exert the external magnetic fields 79 on the electron beams 52 to prevent the electron beams 52 from passing through the cathode holes 41 (in S28). The external magnetic fields 79 may be provided in a direction parallel to the dielectric plate 42a of the hollow cathode 40. The external magnetic fields 79 may be provided to correspond to the cathode holes 41 in a one-to-one manner. The external magnetic fields 79 may be used to deflect the electron beams 52 on the cathode holes 41. The electron beams 52 may be deflected by the external magnetic fields 79. By contrast, the electron beams 52 may be extinguished in the cathode holes 41 by the external magnetic fields 79.

Next, the shutter holes 47 of the shutter plate 46 may be aligned to the cathode holes 41 by a controller (not shown) or an operator (in S30). The reaction gas 22 in the cathode holes 41 and the shutter holes 47 may be provided in the cathode holes 41 and the shutter holes 47.

An RF power may be applied to the reaction gas 22 through the upper electrode 45, thereby generating the lower plasma 104 in the shutter holes 47 and the cathode holes 41 (in S40). A ground voltage may be supplied to the lower electrodes 43. The intensity of the lower plasma 104 may be dependent on the RF power.

When an etching process is performed on the substrate W, the ratio of the ions to the radicals, which are produced from the reaction gas 22, in the reaction plasma 106 of FIG. 1 may be changed depending on the RF power. The ions of the reaction gas 22 may serve to increase an etch rate of the substrate W. However, the ions of the reaction gas 22 may lead to damage of the substrate W. Thus, to suppress or prevent such damage of the substrate W, the RF power may be controlled by a controller (not shown) or the first power supplying unit 32. The reaction plasma may be supplied to the wafer to perform an etching process on the wafer.

In an exemplary embodiment, an etching profile of the wafer caused by the etching process may depend on the predetermined ratio of the ions to the radicals of the reaction plasma 106 of FIG. 1, for example. If the predetermined ratio of the ions to the radicals of the reaction plasma increases, the etching process may cause the etching profile of the wafer to be more anisotropic; and if the predetermined ratio of the ions to the radicals of the reaction plasma 106 decreases, the etching process may cause the etching profile of the wafer to be more isotropic.

Figure 15:
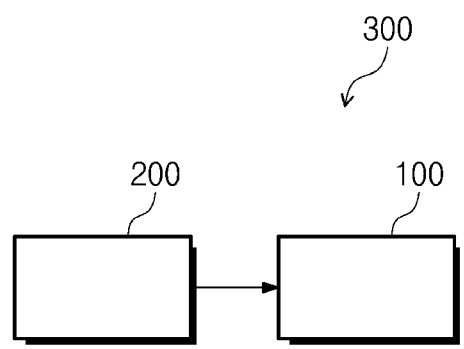
FIG. 15 is a diagram illustrating a semiconductor fabricating system including the plasma processing system of FIG. 1, according to an exemplary embodiment of the present inventive concept.

FIG. 15 is a diagram illustrating a semiconductor fabricating system 300 including the plasma processing system 100 of FIG. 1 according to an exemplary embodiment of the present inventive concept.

Referring to FIG. 15, the semiconductor fabricating system 300 may include a lithography system 200 and the plasma processing system 100. The lithography system 200 may be configured to form a resist pattern (not shown) on the substrate W. The lithography system 200 may include, for example, a spin coater, a baker, a scanner, and a developer. The plasma processing system 100 may etch portions of the substrate W exposed by the resist pattern. In an exemplary embodiment, the plasma processing system 100 may deposit a thin film on the substrate W, before a lithography process using the lithography system 200.

According to an exemplary embodiment of the present inventive concept, a plasma processing system may induce an upper plasma and a lower plasma from a reaction gas. The upper plasma may be induced by an electron beam. Physical properties (e.g., energy or intensity) of the lower plasma may be changed to control a ratio of ions to radicals, which are produced from the reaction gas in a reaction plasma remotely formed from the upper plasma and the lower plasma.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What claimed is:

1. A method of fabricating a semiconductor device on a wafer, the method comprising:
    generating an upper plasma using an electron beam;
    generating, using an RF power, a plurality of lower plasmas that are spaced apart from each other; and
    forming, using the upper plasma and the plurality of lower plasmas, a reaction plasma on the wafer, wherein the reaction plasma has radicals and ions in a predetermined ratio of the ions to the radicals in concentration,
    wherein the forming of the reaction plasma includes:
    providing radicals of the upper plasma and radicals of the plurality of lower plasmas to the reaction plasma;
    providing ions of the plurality of lower plasmas to the reaction plasma; and
    blocking ions of the upper plasma from being provided to the reaction plasma.

2. The method of claim 1,
    wherein the generating of the upper plasma includes:
    receiving a reaction gas; and
    providing the electron beam to the reaction gas in a first direction toward an upper surface of the wafer.

3. The method of claim 2,
    wherein the generating of the upper plasma further includes:
    applying a DC bias to the upper plasma in a second direction parallel to the upper surface of the wafer, the dc bias causing the electron beam to be concentrated so that the electron beam is guided to travel toward the wafer.

4. The method of claim 2,
    wherein the generating of the upper plasma further includes:
    providing an internal magnetic field to the upper plasma to accelerate or decelerate electrons of the electron beam; and
    providing an external magnetic field to the upper plasma in a direction crossing a traveling direction of the electron beam.

5. The method of claim 1,
    wherein the generating of the upper plasma is performed before the generating of the plurality of lower plasmas.

6. The method of claim 1, further comprising:
    supplying the reaction plasma to the wafer to perform an etching process on the wafer,
    wherein an etching profile of the wafer depends on the predetermined ratio of the ions of the reaction plasma to the radicals of the reaction plasma.

7. The method of claim 6,
    wherein if the predetermined ratio of the ions of the reaction plasma to the radicals of the reaction plasma is increased, the etching process causes an etching profile of the wafer to be more anisotropic, and
    wherein if the predetermined ratio of the ions of the reaction plasma to the radicals of the reaction plasma is decreased, the etching process causes an etching profile of the wafer to be more isotropic.

* * * * *